United States Patent
Sakaue et al.

(10) Patent No.: US 10,607,878 B2
(45) Date of Patent: Mar. 31, 2020

(54) TRANSFER DEVICE AND CORRECTION METHOD

(71) Applicant: TOKYO ELECTRON LIMITED, Tokyo (JP)

(72) Inventors: Hiromitsu Sakaue, Nirasaki (JP); Seiji Ishibashi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 351 days.

(21) Appl. No.: 15/364,910

(22) Filed: Nov. 30, 2016

(65) Prior Publication Data

US 2017/0162421 A1 Jun. 8, 2017

(30) Foreign Application Priority Data

Dec. 3, 2015 (JP) .................... 2015-236793

(51) Int. Cl.
*H01L 21/687* (2006.01)
*H01L 21/68* (2006.01)
*H01L 21/677* (2006.01)

(52) U.S. Cl.
CPC .. *H01L 21/68707* (2013.01); *H01L 21/67706* (2013.01); *H01L 21/67742* (2013.01); *H01L 21/67748* (2013.01); *H01L 21/68* (2013.01)

(58) Field of Classification Search
CPC ......... H01L 21/67748; H01L 21/68707; H01L 21/68; H01L 21/67706; H01L 21/67742
See application file for complete search history.

(56) References Cited

U.S. PATENT DOCUMENTS

2013/0180448 A1* 7/2013 Sakaue ............ H01L 21/67739
118/696

FOREIGN PATENT DOCUMENTS

| JP | 11-254359 A | 9/1999 |
| JP | 2003303754 A | 10/2003 |
| JP | 2008-218903 A | 9/2008 |
| JP | 201056161 A | 3/2010 |

* cited by examiner

*Primary Examiner* — Anthony Ho
(74) *Attorney, Agent, or Firm* — Nath, Goldberg & Meyer; Jerald L. Meyer

(57) ABSTRACT

A transfer device includes a rotation driving mechanism for rotationally driving a first linear arm and a second linear arm to move a holding part between a waiting location and a transfer location; a rotation angle detection mechanism for detecting rotation angles of the first linear arm and the second linear arm; a position detection sensor for detecting a position of the second linear arm; a calculation part for calculating a position of the holding part based on the rotation angles of the first linear arm and the second linear arm; and a control part for comparing a position information of the holding part with a position information of the second linear arm and allowing the transfer location to which the target object is transferred to be collected, based on a difference between the position information of the holding part and the position information of the second linear arm.

5 Claims, 6 Drawing Sheets

TRANSFER DEVICE AND CORRECTION METHOD

CROSS-REFERENCE TO RELATED APPLICATION

This application claims the benefit of Japanese Patent Application No. 2015-236793, filed on Dec. 3, 2015, in the Japan Patent Office, the disclosure of which is incorporated herein in its entirety by reference.

TECHNICAL FIELD

The present disclosure relates to a transfer device for transferring a target object such as a semiconductor wafer, a substrate for a liquid crystal, an organic EL device and the like, to a processing chamber, and a method of correcting a transfer location.

BACKGROUND

In a process of manufacturing, for example, a semiconductor device, a liquid crystal panel and the like, various processes such as a film forming process, an etching process, an oxidation process and the like are performed with respect to an target object such as a semiconductor substrate or a substrate for liquid crystal (hereinafter, the semiconductor substrate or the substrate for liquid crystal is simply referred to as a "wafer") inside individual processing containers. In general, when the target object is loaded into and unloaded from the processing containers, a transfer device equipped with a holding part for holding the target object is used. Among various types of transfer devices, a transfer device which reciprocates a holding part by expanding or contracting a single-joint arm or a multi-joint arm is widely used.

In order to align and load the target object at a desired location inside the processing container using the transfer device equipped with the holding part, various alignment technologies have been devised. As an example, a technology for obtaining the central position of a semiconductor wafer and mounting the semiconductor wafer on a predetermined location of a mounting table is known. This technology uses two sensors to always accurately obtain the center of the wafer, thereby enhancing the accuracy of obtaining the center.

However, this technology does not disclose a misalignment involved in a thermal expansion of a transfer arm which supports the holding part for holding the wafer, a correction technique used to address such misalignment, and the like. In general, when various processes such as a film forming process or an etching process are performed with respect to a target object such as a semiconductor substrate, the interior of a processing container is kept under a high temperature condition of, e.g., 700 degrees C. In addition, the processing container and the like are not always kept at a constant temperature, but a temperature may be elevated and varied with time in parallel with the initiation of processing.

The transfer arm which supports the holding part for holding the wafer undergoes a time-dependent change in temperature or is exposed to a high temperature environment. As such, the transfer arm repeatedly undergoes thermal expansion or contraction. Thus, when mounting a target object (object to be processed) within a processing container, there is a need to acquire correct position information of the transfer arm or the holding part according to a temperature state on each occasion, thereby performing alignment. In particular, the transfer arm is generally made of a material of aluminum from the viewpoint of lightening the weight or realizing versatility. Thus, a thermal expansion coefficient of the transfer arm is greater than that of the holding part made of SUS and the like. For this reason, it is important to consider elongation or deformation of the transfer arm in performing the alignment.

That is to say, a rate at which temperature is elevated or dropped within or near a processing container varies with time according to environment. As such, there is a concern that elongation or deformation involved in the environment is exerted on the transfer arm. Therefore, it is necessary to acquire as much position information of the transfer arm as possible, in the vicinity of the processing container and immediately before mounting the target object. In this regard, the conventional technology is designed to address such a requirement by detecting position information of a holding part as a target in the vicinity of an inlet of the processing container, at a time when the holding part is loaded into a processing container. However, the conventional technology does not detect or measure the position of a transfer arm in consideration of the shape of the transfer arm at a timing where a holding part enters a processing container (a state immediately before the transfer arm is fully expanded).

SUMMARY

Some embodiments of the present disclosure provide a transfer device for transferring a target object, which is capable of acquiring position information of a transfer arm in consideration of a change in shape of the transfer arm caused from conditions such as thermal expansion, thermal contraction, or a time-dependent change in temperature resulting in deformation, thus allowing for mounting of the target object at an accurate transfer location with high precision compared to a conventional transfer device.

According to one embodiment of the present disclosure, there is provided a transfer device including a holding part configured to hold a target object, a second linear arm with one end thereof connected to the holding part, and a first linear arm connected to the other end of the second linear arm via a joint part. The transfer device includes: a rotation driving mechanism configured to rotationally drive the first linear arm and the second linear arm so as to move the holding part between a waiting location and a transfer location; a rotation angle detection mechanism configured to detect rotation angles of the first linear arm and the second linear arm; a position detection sensor configured to detect a position of the second linear arm; a calculation part configured to calculate a position of the holding part based on the rotation angles of the first linear arm and the second linear arm detected by the rotation angle detection mechanism; and a control part configured to compare a position information of the holding part calculated by the calculation part with a position information of the second linear arm detected by the position detection sensor and configured to allow the transfer location to which the target object is transferred to be collected, based on a difference between the position information of the holding part and the position information of the second linear arm.

According to another embodiment of the present disclosure, there is provided a correction method of correcting a transfer location to which an target object is transferred, in a transfer device including a holding part configured to hold the target object, a second linear arm with one end thereof connected to the holding part, and a first linear arm connected to the other end of the second linear arm via a joint part. The correction method includes: calculating a position of the holding part based on rotation angles of the first linear arm and the second linear arm; detecting, by a position detection sensor configured to detect the position of the second linear arm, a position of the second linear arm; and comparing a position information of the holding part calculated based on the rotation angles of the first linear arm and the second linear arm with a position information of the second linear arm detected by the position detection sensor and correcting the transfer location to which the target object is transferred, based on a difference between the position information of the holding part and the position information of the second linear arm.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
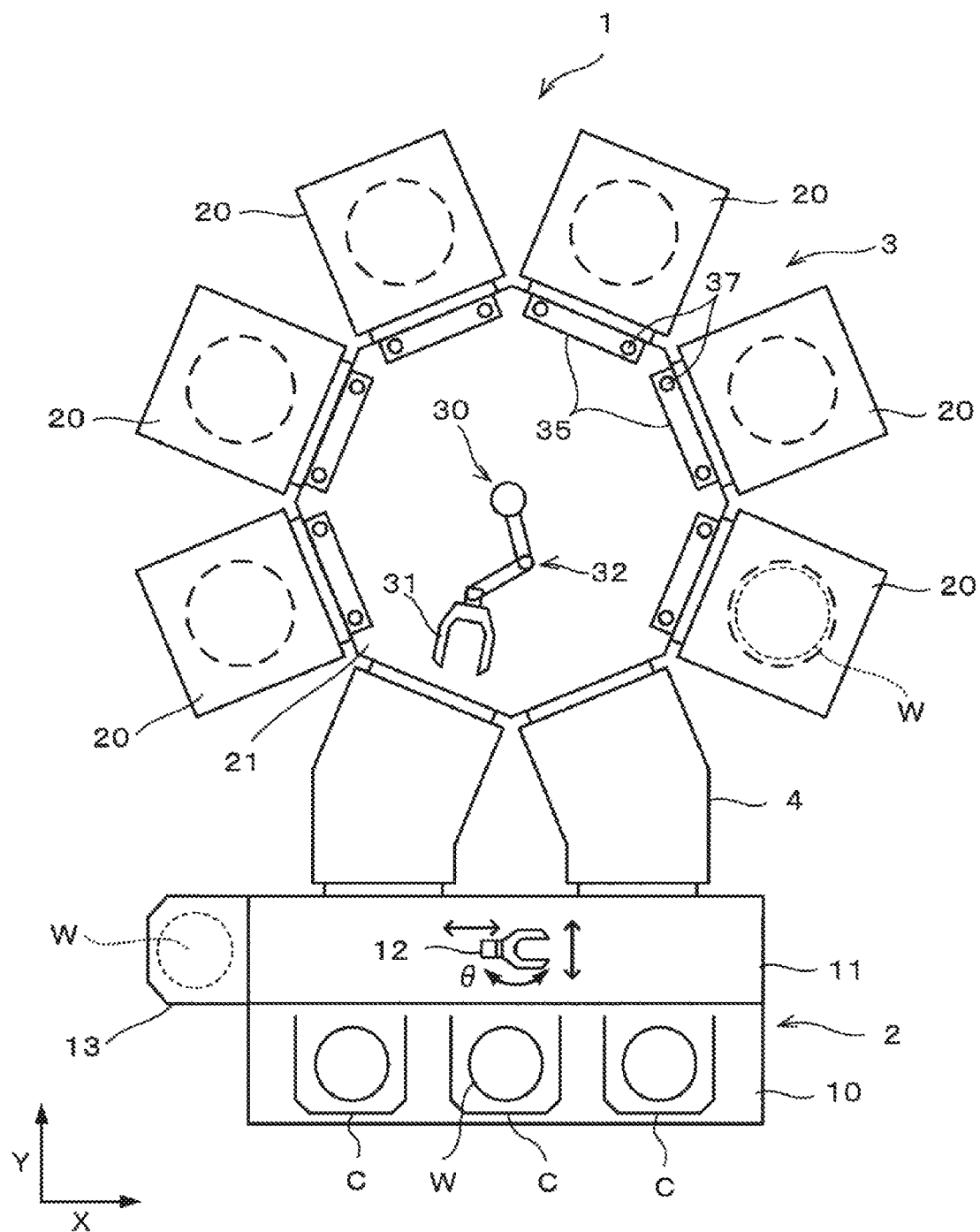
FIG. 1 is a schematic plan view showing a configuration of a substrate processing system to which a transfer device according to an embodiment of the present disclosure is applied.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments. Furthermore, in the specification and drawings, components having substantially identical functional configurations are designated by like reference numerals and thus repeated descriptions thereof will be omitted.

FIG. 1 is a schematic plan view showing a configuration of a substrate processing system 1 to which a transfer device according to an embodiment of the present disclosure is applied. The substrate processing system 1 includes a cassette station 2 for transferring in/out wafers W with respect to the substrate processing system 1 on the basis of a cassette C, and a processing station 3 for processing target objects, e.g., the wafers W. The cassette station 2 and the processing station 3 are configured to be integrally connected to each other via load lock chambers 4.

The cassette station 2 includes a cassette mounting part 10, and a transfer chamber 11 installed adjacent to the cassette mounting part 10. A plurality of (e.g., three) cassettes C each of which can accommodate the plurality of wafers W, can be mounted in a line on the cassette mounting part 10 in the X direction (a left and right direction in FIG. 1). A wafer transfer arm 12 is installed in the transfer chamber 11. The wafer transfer arm 12 is movable in the up-down direction and the left-right direction, and rotatable about a vertical axis (in a direction indicated by θ in FIG. 1), and is configured to transfer the wafer W between the cassettes C of the cassette mounting part 10 and the load lock chambers 4. An alignment device 12 configured to recognize a notch or the like formed in each wafer W and to position the wafers W, is installed at an end portion of the transfer chamber 11 at in the negative X direction.

The processing station 3 includes a plurality of processing chambers 20 for processing the wafers W, and a vacuum transfer chamber 21 having a polygonal shape (an octagonal shape in an example of FIG. 1). Each of the processing chambers 20 is disposed to surround the vacuum transfer chamber 21. In addition, the load lock chambers 4 are connected to the vacuum transfer chamber 21.

A wafer transfer device 30 for transferring the wafer W as a target object or an object to be transferred is installed in the vacuum transfer chamber 21. The wafer transfer device 30 includes a fork 31 as a holding part for holding the wafer W, and a swingable and extendible single-joint arm mechanism 32. With this configuration, the wafer transfer device 30 can transfer the wafer W between the load lock chambers 4, the vacuum transfer chamber 21 and the processing chambers 20. Furthermore, although in FIG. 1 only one arm mechanism 32 has been shown to be installed at the center of the vacuum transfer chamber 21, a plurality of arm mechanisms 32 may be installed.

In the vacuum transfer chamber 21, a plurality of transfer openings 35 through which the wafers W are loaded into and unloaded from the respective process chambers 20 is formed in a boundary between the processing chambers 20 and the vacuum transfer chamber 21, respectively. A plurality of sensors 37 is installed at both sides of the transfer opening 35 facing the respective processing chamber 20 to sense a passage of the wafer W. For example, one set of paired sensors 37 is installed at an upper portion (in two places) of each of the transfer openings 35. With these sensors 37, when the wafer W held by the fork 31 is loaded into the processing chamber 20, a time when the passage of the wafer W is initiated and a time when the passage of the wafer is completed are sensed. Based on a position information thus sensed, the wafer W is mounted at a predetermined location inside the processing chamber 20.

Figure 2:
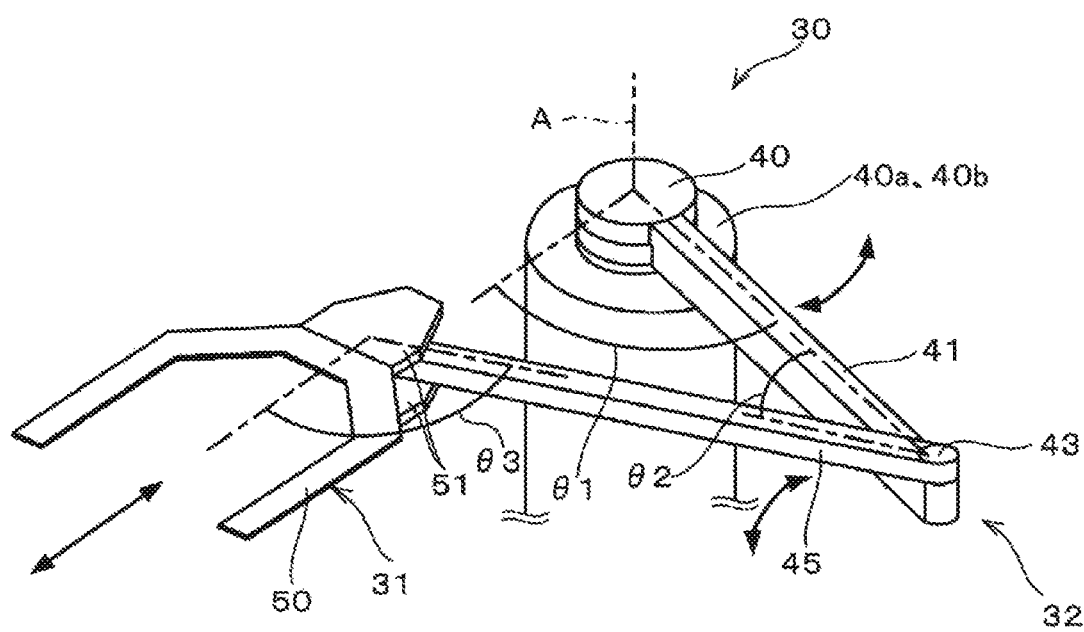
FIG. 2 is a schematic perspective view of a wafer transfer device.

Next, a detailed configuration of the wafer transfer device 30 including the arm mechanism 32 will be described with reference to FIG. 2. FIG. 2 is a schematic perspective view of the wafer transfer device 30. As shown in FIG. 2, the wafer transfer device 30 includes a first linear arm 41 configured to rotate about a center A of a central hub 40 as a rotation axis, and a second linear arm 45 connected to the first linear arm 41 through a joint part 43 formed at a leading end of the first linear arm 41.

Moreover, motors 40a and 40b are connected to the central hub 40 via rotating members (not shown). The first linear arm 41 is configured to rotate about the center A as a rotation axis with an operation of the motor 40a. A rotation angle of the first linear arm 41 is indicated by θ1 (hereinafter, referred to as a "rotation angle θ1 of the first linear arm 41). Meanwhile, with an operation of the motor 40b, the entire arm mechanism 32 is configured to rotate about the center A as a rotation axis.

The second linear arm 45 is configured to rotate about the joint part 43 as a central axis. The fork 31 is installed at a leading end of the second linear arm 45. Here, assuming that an angle defined between the first linear arm 41 and the second linear arm 45 at the joint part 43 is θ2 (hereinafter, referred to as a "rotation angle θ2 of the second linear arm 45"), the angle θ2 varies in conjunction with the rotation angle θ1 of the first linear arm 41. Specifically, an operation is performed such that the angle θ2 is increased as the angle θ1 decreases or the angle θ2 is decreased as the angle θ1 increases. Moreover, an angle θ3 (a connection angle of supporting plates 51 to be described later) defined between the second linear arm 45 and the fork 31 is increased with the expansion of the arm mechanism 32. By properly adjusting these angles θ1 to θ3, the fork 31 installed at the leading end of the arm mechanism 32 can be approximately linearly moved in a radial direction from the center A between the central hub 40 and the respective processing chamber 20.

The arm mechanism 32 performs the expansion/contraction operation thereof by properly using a mechanism such as a belt, a link, a gear and the like (all not shown) under the condition that an isosceles triangle formed by connecting ends of the first linear arm 41 and the second linear arm 45 and having the joint part 43 as an apex is not collapsed. Thus, the arm mechanism 32 substantially linearly expands and contracts the arms with respect to a predetermined transfer location. In other words, the central hub 40 and the motor 40a rotate the first linear arm 41 and the second linear arm 45 such that the fork 31 is moved from a waiting location to a transfer location.

The fork 31 as the holding part includes an approximately U-shaped main body part 50, and the supporting plates 51 for supporting the main body part 50. The main body part 50 is connected to the supporting plates 51 by, for example, a fastening member such as a bolt (not shown). The fork 31 is installed at the leading end of the second linear arm 45 such that the connecting angle θ3 can be properly changed through the supporting plates 51.

Figure 3A:
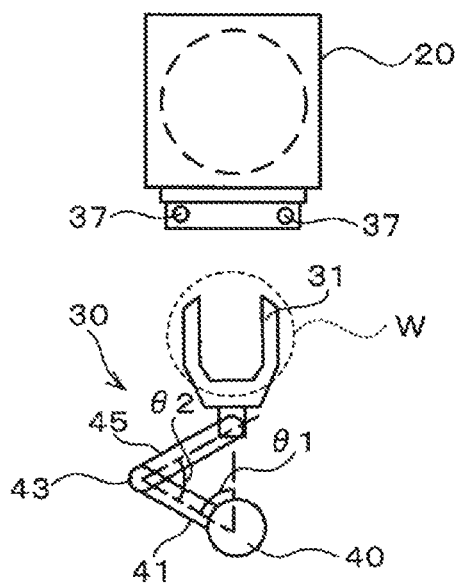
FIGS. 3A to 3C are schematic plan views illustrating operations of the conventional wafer transfer device.
Figure 3B:
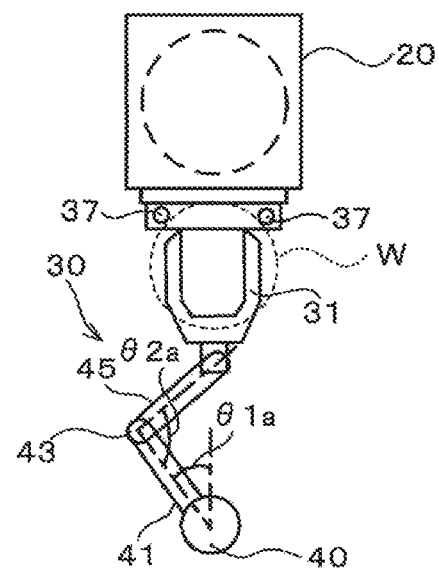
Figure 3C:
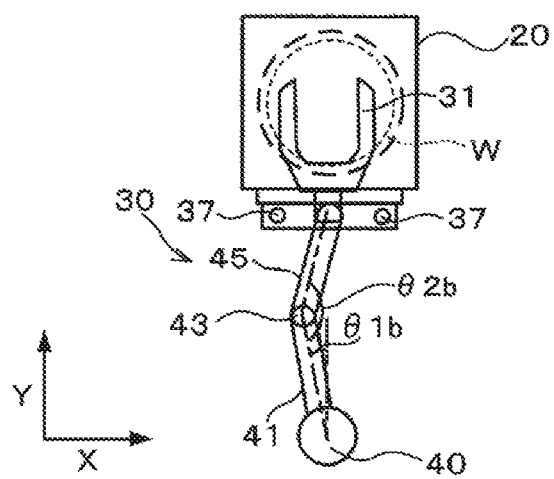

Next, operations of the wafer transfer device 30 configured as described above and the conventional position information acquiring method using such operations will be described with reference to FIGS. 3A to 3C. FIGS. 3A to 3C are schematic plan views illustrating operations of the conventional wafer transfer device 30, which show operations when the wafer W is loaded into the processing chamber 20. FIG. 3A shows a state before the wafer W is transferred, FIG. 3B shows a state when the wafer W is being loaded into the processing chamber 20, and FIG. 3C shows a state after the wafer W has been loaded into the processing chamber 20 (after the loading). The transfer of the wafer W is performed in the order of FIG. 3A to FIG. 3C.

First, as shown in FIG. 3A, the wafer W taken out from the load lock chamber 4 is held on the fork 31 as the holding part of the wafer transfer device 30 and is in a waiting state. As described above, assuming that the rotation angle of the first linear arm 41 is θ1 and the rotation angle of the second linear arm 45 is θ2, a position of the fork 31 in such assumption is defined as the waiting location. From such a state (the waiting state) shown in FIG. 3A, an operation is performed such that the rotation angle θ1 of the first linear arm 41 is decreased and the rotation angle θ2 of the second linear arm 45 is increased. In this way, the wafer W held by the fork 31 is transferred in the Y direction (a direction oriented linearly to the processing chamber 20) in FIG. 3.

Subsequently, as shown in FIG. 3B, the wafer W is transferred up to a location where the wafer W is sensed by the sensors 37 installed at the transfer opening of the processing chamber 20. Thus, a position information of the wafer W is acquired through the sensing. At this time, the rotation angle of the first linear arm 41 is defined as θ1a (<θ1) and the rotation angle of the second linear arm 45 is defined as θ2a (>θ2).

Thereafter, as shown in FIG. 3C, the holding part (the fork 31) of the wafer transfer device 30 is moved up to a final transfer location so that the wafer W is mounted at a predetermined location inside the processing chamber 20. At this time, the rotation angle of the first linear arm 41 is defined as θ1b (<θ1a) and the rotation angle of the second linear arm 45 is defined as θ2b (>θ2a).

As described above, in the conventional transfer method of the wafer W as shown in FIGS. 3A to 3C, an alignment of the wafer W is performed and the wafer W is mounted at the predetermined location inside the processing chamber 20, based on the position information acquired when the sensors 37 initially sense the wafer W and a position information acquired when the wafer W is out of a sensing range of the sensors 37. If the acquired position information is transmitted to a control part (not shown), the control part transmits an operation signal to the motor 40a such that the motor 40a operates. With the operation of the motor 40a, the first linear arm 41 and the second linear arm 45 is rotated and moved. Thus, the wafer W is aligned.

Here, the rotation angle of each of the first and second arms 41 and 45 is detected by a rotation angle detection mechanism (not shown) at a certain timing. A relationship between the rotation angles of the arms detected at the rotation angle detection mechanism and the values obtained when the sensors 37 sense the wafer W is calculated by a calculation part (not shown) such that the position information of the wafer W is obtained.

The operation of the conventional wafer transfer device 30 and the position information acquisition operation were described with reference to FIGS. 3A to 3C. In the case where the position information of the wafer W is acquired by the sensors 37 configured as above, a shape change such as elongation or deformation of the respective arms in a phase after the fork 31 reaches the inside of the processing chamber 20 (i.e., a state immediately before the transfer arm is fully expanded) is not reflected in a process of acquiring the position information. In the state immediately before the transfer arms (the first linear arm 41 and the second linear arm 45) are fully expanded, the elongation or deformation of the transfer arms is significantly exhibited in the Y direction (a direction oriented linearly to the processing chamber 20). In consideration of this circumstance, the present inventors achieved a method of controlling the wafer transfer device 30 according to an embodiment of the present disclosure so as to further improve the accuracy of the mounting of the wafer at the predetermined location. Next, the method of controlling the wafer transfer device 30 according to this embodiment will be described with reference to FIGS. 4A to 4D.

Figure 4A:
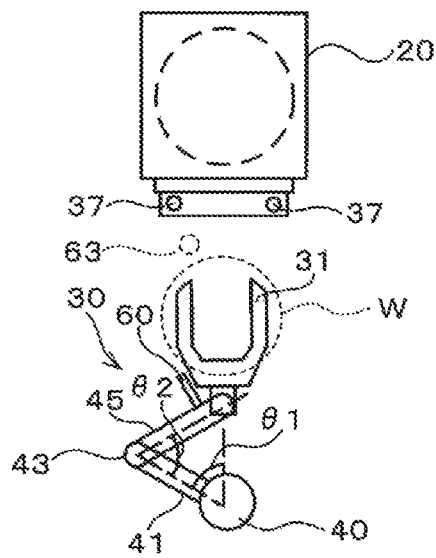
FIGS. 4A to 4D are schematic plan views illustrating operations of a wafer transfer device according to an embodiment of the present disclosure.
Figure 4B:
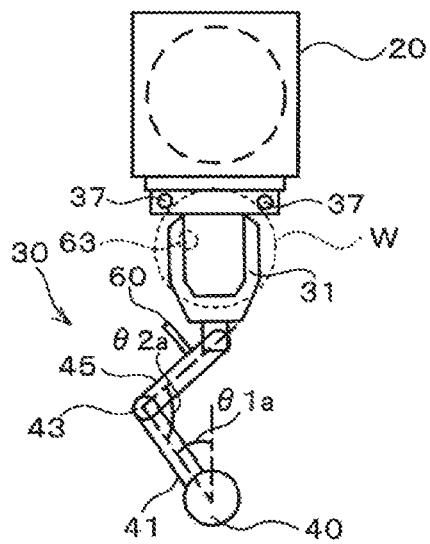
Figure 4C:
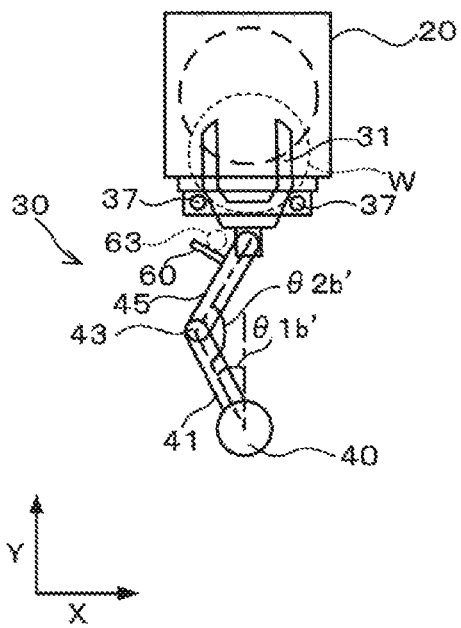
Figure 4D:
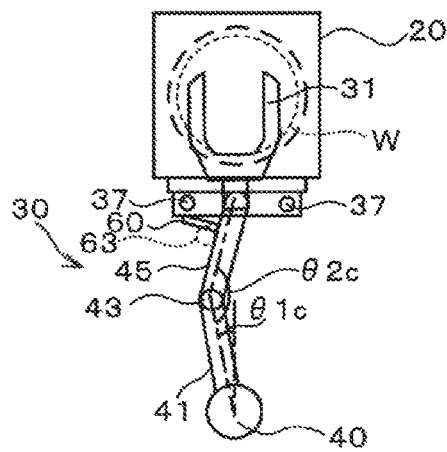

FIGS. 4A to 4D are schematic plan views illustrating an operation of the wafer transfer device 30 according to the embodiment of the present disclosure, which show operations of the wafer transfer device 30 when transferring the wafer W into the processing chamber 20. FIG. 4A shows a state before the wafer W is transferred, FIG. 4B shows a state when the wafer A is being loaded into the processing chamber 20, FIG. 4C shows a state immediately after the wafer W has been loaded into the processing chamber 20 (immediately after loading the wafer), and FIG. 4D shows a state immediately before the wafer W is mounted. The wafer W is transferred in the order of FIG. 4A to FIG. 4D.

The wafer transfer device 30 according to this embodiment is identical in basic configuration with that as described with reference to FIG. 2 and FIGS. 3A to 3C except that a kicker member 60 is installed in the second linear arm 45 in the longitudinal direction thereof, and a kicker sensor 63 is installed to detect a position of the kicker member 60 after the wafer W is loaded into the processing chamber 20 during the operation of the wafer transfer device 30. In other words, the kicker member 60 and the kicker sensor 63 serve as a position detection sensor for the second linear arm 45.

First, as shown in FIG. 4A, the wafer 4 taken out from the load lock chamber 4 is held on the fork 31 as the holding part of the wafer transfer device 30. At this time, the rotation angle of the first linear arm 41 is θ1, the rotation angle of the second linear arm 45 is θ2, and the position of the fork 31 in this state is defined as a waiting location. From the waiting state shown in FIG. 4A, an operation is performed such that the rotation angle θ1 of the first linear arm 41 is decreased and the rotation angle θ2 of the second linear arm 45 is increased. Thus, the wafer W held on the fork 31 is transferred in the Y direction (a direction oriented linearly to the processing chamber 20) in FIG. 4C.

Subsequently, as shown in FIG. 4B, the wafer is transferred up to a location where the sensors 37 installed in the transfer opening 35 of the processing chamber 20 sense the wafer W. The acquisition of a position information of the wafer W is initiated by the sensing. At this time, the rotation angle of the first linear arm 41 is defined as θ1a (<θ1) and the rotation angle of the second linear arm 45 is defined as θ2a (>θ2).

Thereafter, as shown in FIG. 4C, immediately after the wafer F is loaded into the processing chamber 20, the sensing of the wafer W by the sensors 37 is terminated. That is to say, the acquisition of the position information of the wafer W performed by the sensors 37 is terminated. Furthermore, after the wafer W is loaded into the processing chamber 20, a detection of the kicker member 60 performed by the kicker sensor 63 is initiated. At this time, the rotation angle of the first linear arm 41 is defined as θ1b' (<θ1a) and the rotation angle of the second linear arm 45 is defined as θ2b' (>θ2a).

Subsequently, as shown in FIG. 4D, the detection of the kicker member 60 by the kicker sensor 63 is completed and a position information of the wafer W is acquired based on the detection result. Based on the acquired position information, the wafer W is aligned. The holding part (the fork 31) of the wafer transfer device 30 is moved up to a final transfer location so that the wafer W is mounted at a predetermined location inside the processing chamber 20. At this time, the rotation angle of the first linear arm 41 is defined as θ1c (<θ1b') and the rotation angle of the second linear arm 45 is defined as θ2c (>θ2b').

Moreover, if the acquired position information is transmitted to a control part (not shown), the control part transmits operation signals to the motors 40a and 40b such that the motors 40a and 40b operate. With the operation of the motors 40a and 40b, the first linear arm 41, the second linear arm 45 and the arm mechanism 32 is integrally rotated and moved. Thus, the wafer W is aligned.

Here, the rotation angle of each of the first and second arms 41 and 45 is detected by a rotation angle detection mechanism (not shown) at a certain timing. A relationship between the rotation angles of the first and second arms 41 and 45 detected at the rotation angle detection mechanism and the values obtained when the sensors 37 sense the wafer W is calculated by a calculation part (not shown) such that the position information of the wafer W is obtained until the sensing of the wafer W by the sensors 37 is terminated.

Meanwhile, with the kicker member 60 and the kicker sensor 63 which serve as a position detection sensor for the second linear arm 45, the position information of the wafer W is acquired even after the sensing operation of the sensors 37 is terminated. The position information of the wafer W which is acquired by the rotation angle detection mechanism and the sensors 37 is compared with the position information of the wafer W which is acquired by the kicker member 60 and the kicker sensor 63 serving as the position detection sensor for the second linear arm 45 to calculate a difference therebetween. Based on the difference, the control part (not shown) corrects the position of the wafer W to determine a final mounting location of the wafer W. Thus, it is possible to mount the wafer W at a predetermined location with high precision.

In some embodiments, an installation position of the kicker member 60 and a positional relationship between the kicker member 60 and the kicker sensor 63 may be configured such that the kicker sensor 63 can sense the kicker member 62 in a region where the second linear arm 45 moves at a constant speed and a region where the second linear arm 45 is decelerated, in the course of transferring the wafer W as shown in FIG. 4.

Figure 5A:
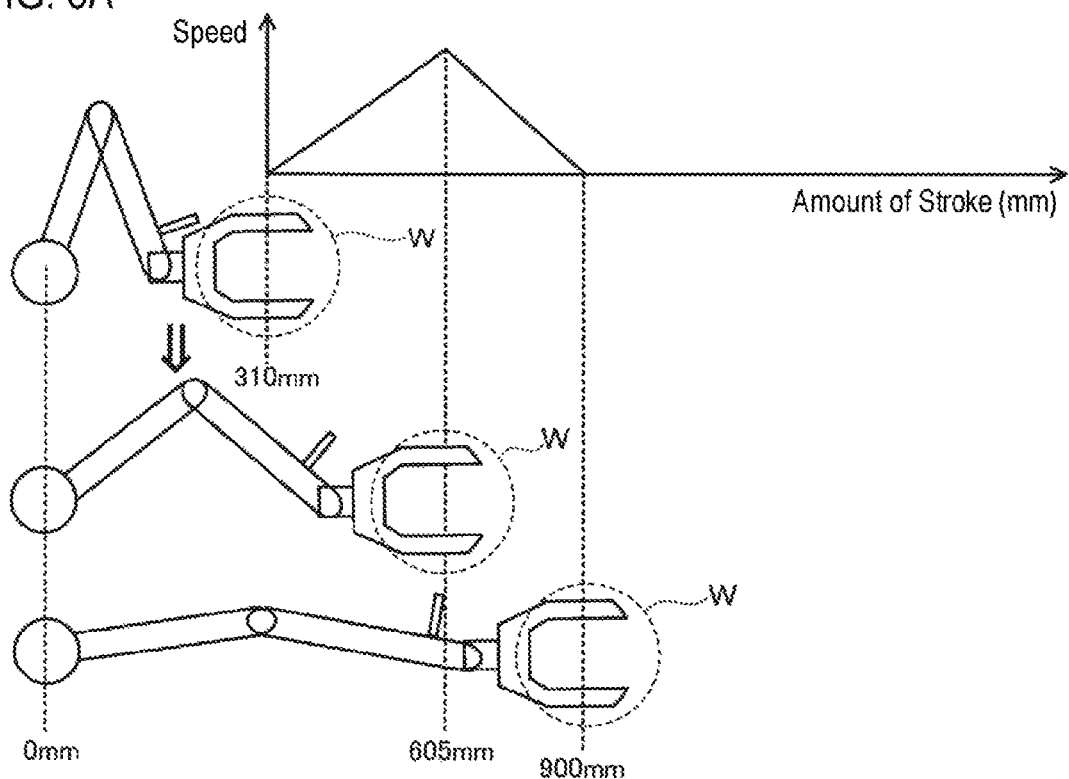
FIGS. 5A and 5B are schematic explanatory views showing operation states of an arm mechanism.
Figure 5B:
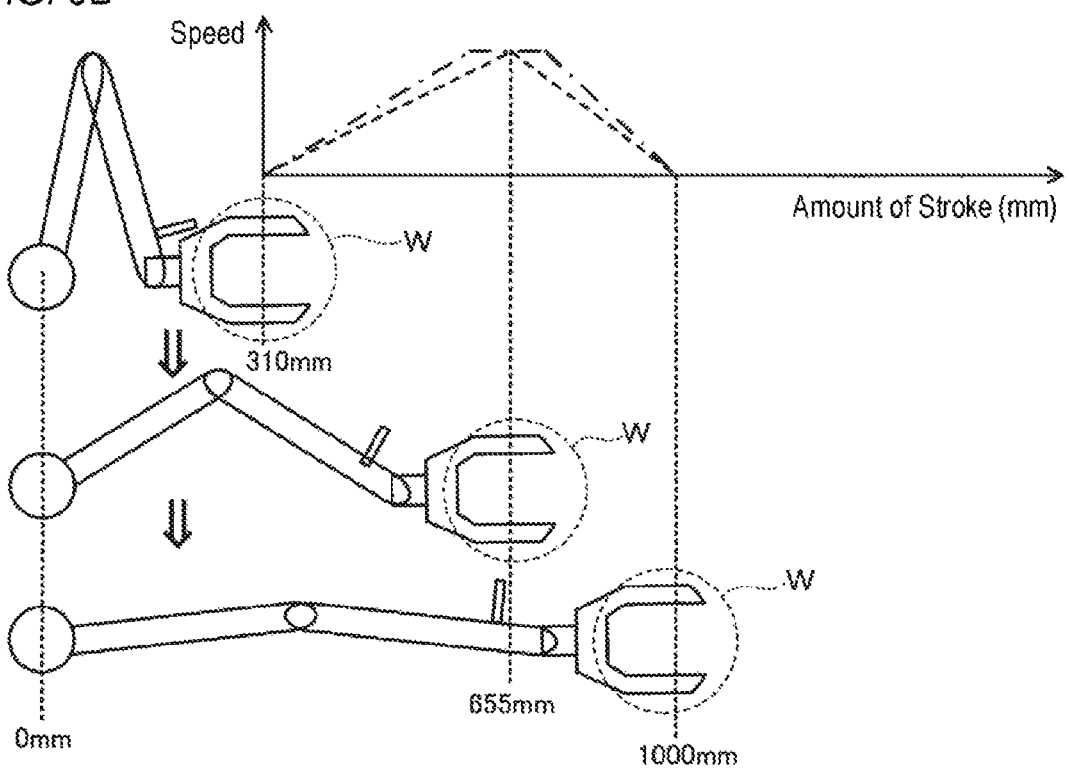

Here, a specific definition of the constant speed region or the deceleration region in the operation of the arm mechanism 32 (in particular, the second linear arm 45) will be described. FIGS. 5A and 5B are schematic explanatory views showing operation states of the arm mechanism 32. Specifically, FIGS. 5A and 5B are schematic views of operation states that occur at a transfer location (a location where the wafer W is delivered) which are set to fall within a range of 900 to 1,000 mm away from a center position of the arm mechanism 32, which is assumed as 0 mm. In FIGS. 5A and 5B, a center position (an arm waiting location) of the wafer W in a revolving radius when the arm mechanism 32 is operated is set to be about 310 mm. In practice, the transfer of the wafer W is initiated in the vicinity of the position of 310 mm. The wafer W is moved up to the transfer location where the wafer W is delivered. In FIG. 5, by way of examples of the operations of the arm mechanism 32, there are shown a case in which an intermediate point in the operation is 605 mm and the transfer location is 900 mm (FIG. 5A), and a case in which the intermediate point is 655 mm and the transfer location is 1,000 mm (FIG. 5B).

Further, FIGS. 5A and 5B also graphically show examples of a speed of the arm in the operation of the arm mechanism 32. The graph of FIG. 5A represents a speed variance in a triangular operation pattern (indicated by a solid line in FIG. 5A) in which the intermediate point is 605 mm and the transfer location is 900 mm. The graph of FIG. 5B represents a speed variance in a triangular operation pattern (indicated by a broken line) in which the intermediate point is 655 mm and the transfer location is 1,000 mm, together with a speed variance in a trapezoidal operation pattern (indicated by a one-dot chain line) in which the intermediate point is near 655 mm and the transfer location is 1,000 mm.

In general, it has been known that the arm mechanism 32 is operated in the triangular operation pattern, the trapezoidal operation pattern or a spline operation pattern. As shown in the graphs of FIGS. 5A and 5B, the arm mechanism 32 basically operates at a maximum speed at the intermediate point (the range of 605 mm to 655 mm) and then enters the constant speed region or the deceleration region immediately after passing through that intermediate point. The term "constant speed region" used herein means a region (interval) in which the arm mechanism 32 continues to operate while maintaining at the maximum speed, like the case of the trapezoidal operation pattern shown in FIG. 5B. If there is a constant speed region, a region after the constant speed region becomes the deceleration region. The constant speed region or the deceleration region corresponds to a region beyond the intermediate point in the course of transferring the wafer W. By allowing the kicker sensor 63 to sense the kicker member 60 in such a region, the acquisition of the position information of the wafer W is performed even at a location where the arm mechanism 32 is expanded to some extent.

As described above with reference to FIGS. 4A to 4D, according to the technology of this embodiment, the position of the wafer W is corrected based on the position information acquired by the sensors 37 as well as the position information acquired by the kicker member 60 and the kicker sensor 63. At this time, the acquisition of the position information by the kicker member 60 and the kicker sensor 63 is performed at a location closer to the predetermined location where the wafer W is originally mounted. In other words, it is possible to acquire and correct the position information immediately before the first linear arm 41 and the second linear arm 45 are fully expanded in the Y direction. Therefore, it is possible to mount the wafer W at an accurate location with high precision as compared with the conventional technology. In particular, the first linear arm 41 and the second linear arm 45 are significantly elongated and deformed due to an elevated or dropped temperature in the Y direction. In consideration of such elongation and deformation, it is possible to acquire and correct the position information of the wafer W, thus mounting the wafer W at an accurate location with extremely high precision.

Further, in general, the substrate processing system 1 to which the wafer transfer device 30 according to this embodiment is applied, continues to process a plurality of target objects (the plurality of wafers W). For example, in the case where the substrate processing system 1 continues to process the plurality of wafers W for about 6 to 7 hours, the temperatures of the first linear arm 41 and the second linear arm 45 are changed with time and are in a steady state after a predetermined period of time. In this case, even in a phase in which the temperatures of the first linear arm 41 and the second linear arm 45 are changed with time, it is possible to always acquire and correct the position information of the wafer W in consideration of the elongation and deformation of the arms through changes in temperature. It is therefore possible to always mount the wafer W at an accurate location with high precision irrespective of a processing state or elapsed processing time.

Next, the temperature change of the arms and the elongation/deformation caused thereby on transfer device 30 of the substrate processing system 1 according to this embodiment will be discussed.

Figure 6:
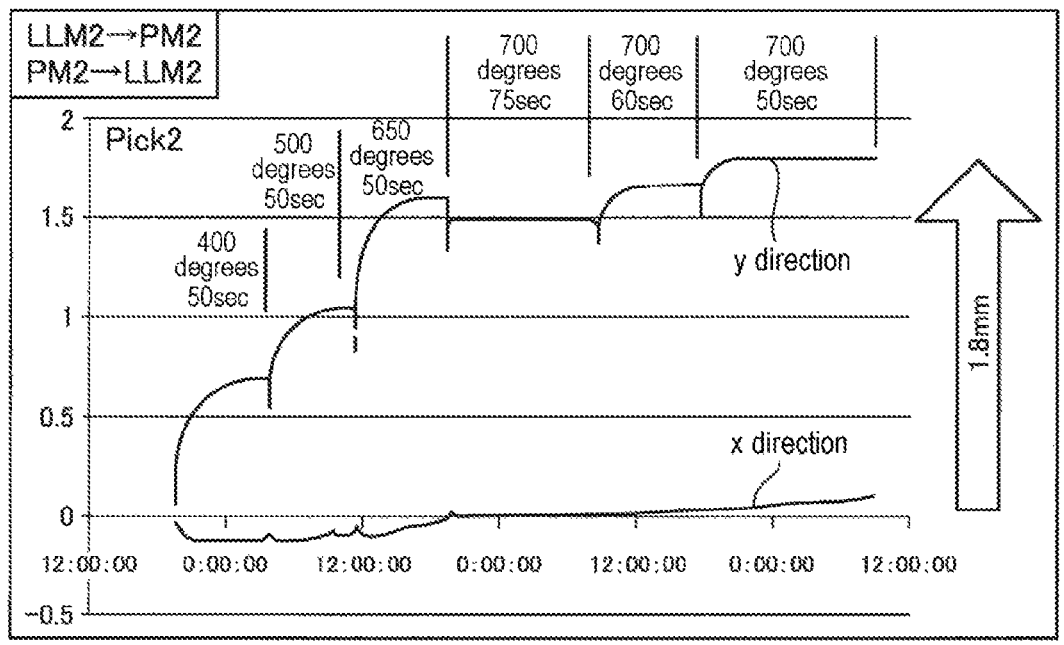
FIG. 6 is a graph showing results obtained by performing an evaluation for the amount of elongation in a leading end of an arm mechanism Pick2 which was reciprocated between load lock chambers and processing chambers.

FIG. 6 is a graph showing results obtained by reciprocating the arm mechanism 32 (Pick2: a name of a part corresponding to the fork 31 in this embodiment) which holds the processed wafer W between the load lock chamber 4 and the processing chamber 20 in the substrate processing system 1 according to this embodiment and by evaluating the amount of extension of the leading end of the arm mechanism 32. In FIG. 6, the y-direction is a transfer direction (a radial direction from the center A) and the x-direction is a direction orthogonal to the transfer direction. The evaluation shown in the graph of FIG. 6 was performed under the condition that a set temperature of the processing chamber 20 falls within a range of 400 to 700 degrees C. and a process time of the processing chamber 20 falls within a range of 50 to 75 sec.

As shown in FIG. 6, it can be seen that the amount of elongation of the leading end of the arm mechanism 32 is mainly increased in the y-direction as the transfer of the wafer W is repeated. Moreover, it can be also seen that the amount of elongation of the leading end is changed with time as the transfer and reciprocation operations are repeated. For this reason, it can be seen that, in order to always mount the wafer W at an accurate location with high precision regardless of a processing state or elapsed processing time, it is important to perform the acquisition and correction of the position information in consideration of the elongation and deformation of the arms as described above.

Although one example of the embodiment of the present disclosure has been described above, the present disclosure is not limited thereto. It is apparent to those skilled in the art that various modifications or changes may be conceived within the scope of the spirit set forth in the appended claims and it is understood that the modifications and changes fall within the technical scope of the present disclosure.

For example, although in the above embodiment, the configuration in which the kicker member 60 is installed in the second linear arm 45 in the longitudinal direction and the kicker sensor 63 is disposed to sense the kicker member 60 has been shown, the present disclosure is not limited thereto. That is to say, the present disclosure is not particularly restricted as long as position information of a wafer can be acquired and corrected immediately before the first linear arm 41 and the second linear arm 45 are fully expanded in the Y direction. Further, the shape or configuration of the kicker member 60 is not particularly restricted. In some embodiments, the second linear arm 45 may be configured to have a sensible shape such as a cut-away shape (or cut-away portion) instead of installing the kicker member 60. In this case, a sensor (corresponding to the kicker sensor 63) for sensing the cut-away portion may be installed.

In addition, although the configuration in which the kicker sensor 63 is installed has been described in the aforementioned embodiment, the sensors 37 installed at the transfer opening 35 of the processing chamber 20 may be used as the kicker sensor 63. This eliminates a need to newly install the kicker sensor 63. Further, the installation and configuration of the kicker member 60 is not particularly restricted as long as the kicker member 60 can be sensed by the sensors 37 immediately before the first linear arm 41 and the second linear arm 45 are fully expanded in the Y direction.

Figure 7:
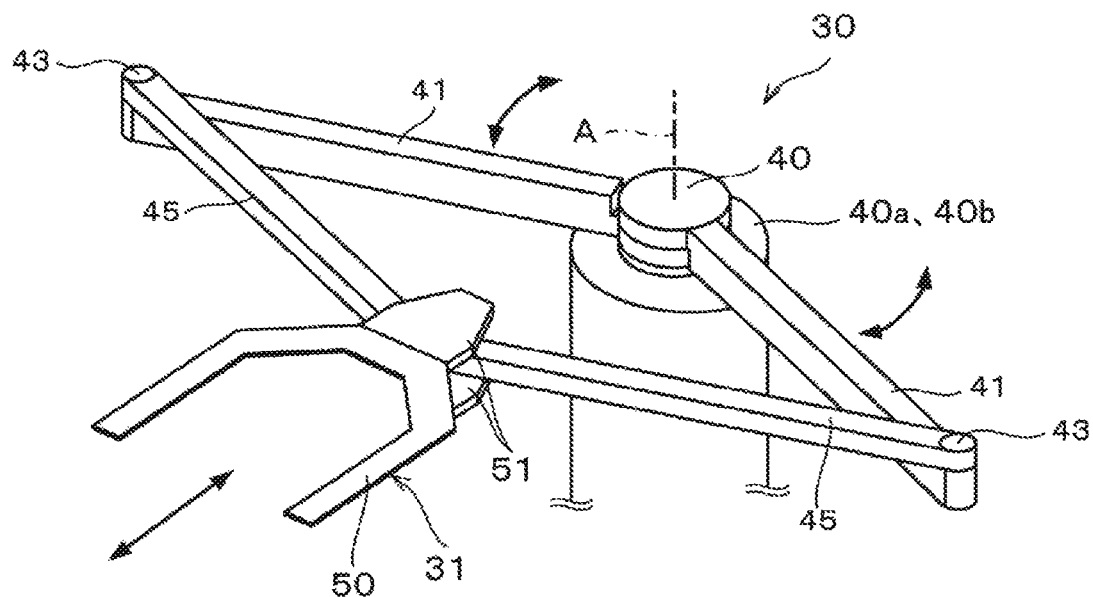
FIG. 7 is a schematic explanatory view of an arm mechanism having a configuration called a frog-leg type.

Moreover, although the swingable and extendible single-joint configuration having the first and second linear arms 41 and 45 and the fork 31 has been described by way of example of the configuration of the arm mechanism 32 in the aforementioned embodiment, the application of the present disclosure is not limited thereto. In some embodiments, the present disclosure may be applied to an arm mechanism equipped with a pair of first linear arms 41 and a pair of second linear arms 45, called a frog leg type as shown in FIG. 7. However, this requires a configuration or a sensor that corresponds to a kicker member configured to perform a sensing operation immediately before the first linear arms 41 and the second linear arms 45 are fully expanded in the Y direction, for each of the pair of second linear arms 45.

Example

In the substrate processing system 1 configured as shown in FIGS. 1 and 2, by way of example of the present disclosure, the conventional correction method shown in FIG. 3 and the correction method according to the present disclosure shown in FIG. 4 were applied under an elevated temperature condition (a condition that temperature is elevated with time) and a room temperature condition (a condition that temperature is constant), respectively, and wafers W were repeatedly transferred and mounted by an arm mechanism, and an amount of misalignment of the wafers W was measured at this state. As a result, under the elevated temperature condition, the amount of misalignment in the conventional correction method was 0.91 mm and the amount of misalignment in the correction method according to the present disclosure was 0.21 mm Under room temperature conditions, the amount of misalignment in the conventional correction method was 0.35 mm and the amount of misalignment in the correction method according to the present disclosure was 0.29 mm.

Even under the elevated temperature condition and the room temperature condition, the amount of misalignment in the correction method according to the present disclosure was found to be smaller than that in the conventional correction method. Thus, the measurement shows that the alignment of the wafer W is performed with high precision. In addition, under the elevated temperature condition, a small difference was generated between the amounts of misalignment in both the conventional correction method and the correction method according to the present disclosure, whereas under room temperature conditions, a large difference was generated between the amounts of misalignment in both the conventional correction method and the correction method according to the present disclosure. Thus, it can be seen that the correction method according to the present disclosure is more effective under the elevated temperature condition in which temperature varies with time or a dropped temperature condition similar thereto.

The present disclosure can be applied to a transfer device for transferring a target object, especially a workpiece such as a semiconductor wafer, a substrate for a liquid crystal, an organic EL device to a processing chamber, and a correction method of correcting a transfer location.

According to the present disclosure in some embodiments, it is possible to acquire position information of a transfer arm in consideration of a change in shape of the transfer arm, such as thermal expansion, thermal contraction or deformation caused by a time-dependent change in temperature, in a transfer device for transferring a target object, thus mounting the target object at an accurate transfer location with high precision compared to a conventional transfer device.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A transfer device including a holding part configured to hold a target object, a second linear arm with one end thereof connected to the holding part, and a first linear arm connected to the other end of the second linear arm via a joint part, the transfer device comprising:
    a rotation driving mechanism configured to rotationally drive the first linear arm and the second linear arm so as to move the holding part between a waiting location and a transfer location;
    a rotation angle detection mechanism configured to detect rotation angles of the first linear arm and the second linear arm;
    a position detection sensor configured to detect a position of the second linear arm;
    a calculation part configured to calculate a position of the holding part based on the rotation angles of the first linear arm and the second linear arm detected by the rotation angle detection mechanism; and
    a control part configured to compare a position information of the holding part calculated by the calculation part with a position information of the second linear arm detected by the position detection sensor and configured to allow the transfer location to which the target object is transferred to be corrected, based on a difference between the position information of the holding part and the position information of the second linear arm.

2. The transfer device of claim 1, wherein the position detection sensor configured to detect the position of the second linear arm includes a kicker member installed in the second linear arm in a longitudinal direction of the second linear arm, and a kicker sensor configured to detect the kicker member.

3. The transfer device of claim 2, wherein the detection of the kicker member by the kicker sensor is performed only in a region where the second linear arm moves at a constant speed or a region where the second linear arm is decelerated when the second linear arm is rotationally driven.

4. The transfer device of claim 1, wherein the position detection sensor configured to detect the position of the second linear arm includes a cut-away portion formed in the second linear arm in a longitudinal direction of the second linear arm, and a sensor configured to detect the cut-away portion.

5. The transfer device of claim 1, wherein each of the first linear arm and the second linear arms is installed in paired arms.

* * * * *